(12) United States Patent
Kim et al.

(10) Patent No.: US 12,317,677 B2
(45) Date of Patent: May 27, 2025

(54) DISPLAY DEVICE INCLUDING PROTECTIVE WINDOW

(71) Applicant: Samsung Display Co., LTD., Yongin-si (KR)

(72) Inventors: Min-Joo Kim, Bucheon-si (KR); Jong-Hyun Choi, Seoul (KR); Sun-Hee Lee, Hwaseong-si (KR); Seung-Min Lee, Hwaseong-si (KR); Tae-Hyun Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 607 days.

(21) Appl. No.: 17/596,193

(22) PCT Filed: Nov. 18, 2019

(86) PCT No.: PCT/KR2019/015773
§ 371 (c)(1),
(2) Date: Dec. 3, 2021

(87) PCT Pub. No.: WO2020/246668
PCT Pub. Date: Dec. 10, 2020

(65) Prior Publication Data
US 2022/0255044 A1    Aug. 11, 2022

(30) Foreign Application Priority Data
Jun. 5, 2019    (KR) .................. 10-2019-0067015

(51) Int. Cl.
*H10K 50/85*    (2023.01)
*H10K 50/84*    (2023.01)
(Continued)

(52) U.S. Cl.
CPC ......... *H10K 50/858* (2023.02); *H10K 50/844* (2023.02); *G06F 1/1652* (2013.01);
(Continued)

(58) Field of Classification Search
CPC .... H10K 50/858; H10K 50/844; H10K 59/12; H10K 59/00; H10K 59/122;
(Continued)

(56) References Cited

U.S. PATENT DOCUMENTS 9,029,886 B2 * 5/2015 Namkung .............. H10K 50/84
349/60
9,287,329 B1 * 3/2016 Lee ........................ H10K 50/86
(Continued)

FOREIGN PATENT DOCUMENTS

CN    106340242 A    1/2017
CN    108663840       10/2018
(Continued)

OTHER PUBLICATIONS

International Search Report of corresponding PCT/KR2019/015773, Mar. 4, 2020, 4 pages.
(Continued)

*Primary Examiner* — Ida M Soward
(74) *Attorney, Agent, or Firm* — Womble Bond Dickinson (US) LLP (57) ABSTRACT

A display device including a flat area extending in a direction and a bending area having a curvature is provided. The display device includes a panel part including a pixel array and including a first active area located in the flat area and a second active area located in the bending area, a protective window covering the panel part, and a high-refractive member on the panel part in the bending area and including a material having a refractivity greater than a refractivity of the protective window.

20 Claims, 6 Drawing Sheets

(51) Int. Cl.
*H10K 50/844* (2023.01)
*H10K 50/858* (2023.01)
*H10K 59/12* (2023.01)
*G06F 1/16* (2006.01)
*G09F 9/30* (2006.01)
*H10K 59/122* (2023.01)
*H10K 77/10* (2023.01)
*H10K 102/00* (2023.01)
*H10K 102/10* (2023.01)

(52) U.S. Cl.
CPC .............. *G09F 9/301* (2013.01); *H10K 59/12* (2023.02); *H10K 59/122* (2023.02); *H10K 77/111* (2023.02); *H10K 2102/101* (2023.02); *H10K 2102/311* (2023.02); *H10K 2102/331* (2023.02)

(58) Field of Classification Search
CPC ........... H10K 77/111; H10K 2102/101; H10K 2102/311; H10K 2102/331; H10K 59/879; H10K 2102/00; G06F 1/1652; G09F 9/301
See application file for complete search history.

(56) References Cited

U.S. PATENT DOCUMENTS

| | | | |
|---|---|---|---|
| 9,430,180 B2* | 8/2016 | Hirakata | G06F 3/1446 |
| 10,216,469 B2* | 2/2019 | Kang | G06F 3/0488 |
| 10,380,938 B2* | 8/2019 | Su | G09G 3/03 |
| 10,804,485 B2 | 10/2020 | Kwon et al. | |
| 10,896,943 B2* | 1/2021 | Kim | H10K 50/844 |
| 11,041,057 B2 | 6/2021 | Han et al. | |
| 11,106,099 B2* | 8/2021 | Yamazaki | G02F 1/133308 |
| 2014/0063719 A1* | 3/2014 | Yamazaki | G06F 1/1626 |
| | | | 361/679.21 |
| 2014/0065430 A1* | 3/2014 | Yamazaki | H10K 59/873 |
| | | | 445/25 |
| 2014/0098471 A1* | 4/2014 | Nam | H05K 7/00 |
| | | | 361/679.01 |
| 2014/0168090 A1* | 6/2014 | Aaltonen | G06F 3/041 |
| | | | 156/60 |
| 2014/0192534 A1 | 7/2014 | Cho | |
| 2014/0306260 A1* | 10/2014 | Yamazaki | H10K 59/40 |
| | | | 257/99 |
| 2014/0306985 A1* | 10/2014 | Jeong | G06F 1/1652 |
| | | | 345/600 |
| 2014/0354143 A1* | 12/2014 | Jung | G06F 3/041 |
| | | | 313/511 |
| 2014/0355227 A1 | 12/2014 | Lim | |
| 2015/0115229 A1 | 4/2015 | Jung | |
| 2015/0138072 A1* | 5/2015 | Yamazaki | G06F 1/1643 |
| | | | 345/156 |
| 2016/0071457 A1* | 3/2016 | Kim | G09G 3/3208 |
| | | | 345/76 |
| 2016/0293895 A1* | 10/2016 | Kim | H10K 50/8428 |
| 2016/0316582 A1* | 10/2016 | Seo | G02F 1/13 |
| 2017/0059749 A1* | 3/2017 | Wakatsuki | C03C 21/00 |
| 2017/0092703 A1 | 3/2017 | Bae et al. | |
| 2018/0031880 A1* | 2/2018 | Kwak | G06F 3/0443 |
| 2018/0113241 A1 | 4/2018 | Powell et al. | |
| 2018/0114474 A1 | 4/2018 | Powell et al. | |
| 2018/0182838 A1* | 6/2018 | Yeo | H10K 50/844 |
| 2018/0348567 A1 | 12/2018 | Shin et al. | |
| 2019/0146261 A1* | 5/2019 | Im | G02F 1/133305 |
| | | | 349/106 |
| 2019/0347989 A1* | 11/2019 | Lee | G09G 3/3275 |
| 2021/0157453 A1* | 5/2021 | Myers | G06F 3/0488 |

FOREIGN PATENT DOCUMENTS

| | | |
|---|---|---|
| CN | 109216584 A | 1/2019 |
| CN | 109239830 A | 1/2019 |
| KR | 10-2014-0090498 | 7/2014 |
| KR | 10-2014-0142418 | 12/2014 |
| KR | 10-2015-0136317 A | 12/2015 |
| KR | 10-2016-0003487 | 1/2016 |
| KR | 10-2016-0148102 | 12/2016 |
| KR | 10-2018-0068252 A | 6/2018 |

OTHER PUBLICATIONS

Chinese Office Action dated Apr. 22, 2024, issued in corresponding Chinese Patent Application 201980097203.8 (8 pages).

* cited by examiner

DISPLAY DEVICE INCLUDING PROTECTIVE WINDOW

CROSS-REFERENCE TO RELATED APPLICATIONS

This application is a U.S. National Phase patent application of International Patent Application Number PCT/KR2019/015773, filed on Nov. 18, 2019, which claims priority to Korean Patent Application Number 10-2019-0067015, filed on Jun. 5, 2019, the entire contents of both of which are incorporated herein by reference.

FIELD

Aspects of embodiments of the present invention relate to a display device. More particularly, aspects of embodiments of the invention relate to a display device including a protective window.

BACKGROUND

Generally, a display device includes a display area displaying an image and a non-display area not displaying an image. Reducing a bezel, which is defined by a non-display area perceived by users, may provide various advantages. For example, a display area may be relatively increased, immersion of users may be increased, and aesthetic sensibility of a display device may be improved.

Thus, various developments are being conducted to decrease a bezel of a display device.

SUMMARY

According to one aspect of embodiments of the invention, a display device with a reduced bezel is provided.

The invention may, however, be embodied in many different forms and should not be construed as limited to the embodiments set forth herein.

According to one or more embodiments of the invention, a display device includes a flat area extending in a direction and a bending area having a curvature. The display device includes a panel part including a pixel array and including a first active area located in the flat area and a second active area located in the bending area, a protective window covering the panel part, and a high-refractive member on the panel part in the bending area and including a material having a refractivity greater than a refractivity of the protective window.

In an embodiment, the high-refractive member is between the protective window and the panel part in the bending area.

In an embodiment, the protective window is between the high-refractive member and the panel part in the bending area.

In an embodiment, the high-refractive member is between a first low-refractive layer and a second low-refractive layer of the protective window in the bending area.

In an embodiment, the protective window includes glass, and the high-refractive member includes at least one selected from the group consisting of polymethyl methacrylate, polyvinyl alcohol, polyimide, cyclic olefin copolymer, and polycarbonate.

In an embodiment, the protective window includes polyimide, and the high-refractive member includes at least one selected from the group consisting of cyclic olefin copolymer and polycarbonate.

In an embodiment, the high-refractive member includes a cured acrylic resin.

In an embodiment, the high-refractive member includes inorganic nano-particles dispersed in a flexible polymer matrix or in a cured resin.

In an embodiment, the inorganic nano-particles include at least one selected from the group consisting of niobium oxide, barium oxide, titanium oxide, zirconium oxide, and tungsten oxide.

In an embodiment, the high-refractive member includes a metal oxide layer.

In an embodiment, the high-refractive member includes a high-refractive glass including at least 15 wt % of niobium oxide, barium oxide, titanium oxide, zirconium oxide, tungsten oxide, or a combination thereof.

In an embodiment, the display device further includes a light-blocking member that overlaps a non-display area of the panel part in the bending area.

In an embodiment, a thickness of the protective window in the bending area is less than a thickness of the protective window in the flat area.

In an embodiment, the pixel array includes an organic light-emitting diode.

A display device according to one or more embodiments of the invention includes a flat area extending in a direction and a bending area having a curvature. The display device includes a panel part including a pixel array and including a first active area located in the flat area and a second active area located in the bending area, and a protective window covering the panel part. The protective window includes a low-refractive portion located in the flat area and a high-refractive portion located in the bending area and having a refractivity greater than a refractivity of the low-refractive portion.

According to embodiments of the invention, a path of a light exiting from a bending area may be adjusted such that a size of a display area perceived by a user may be increased and a size of a bezel may be reduced.

DETAILED DESCRIPTION

A display device according to embodiments will be described more fully herein with reference to the accompanying drawings, in which some embodiments are shown. In the accompanying drawings, same or similar reference numerals may be used for same or similar elements.

Figure 1:
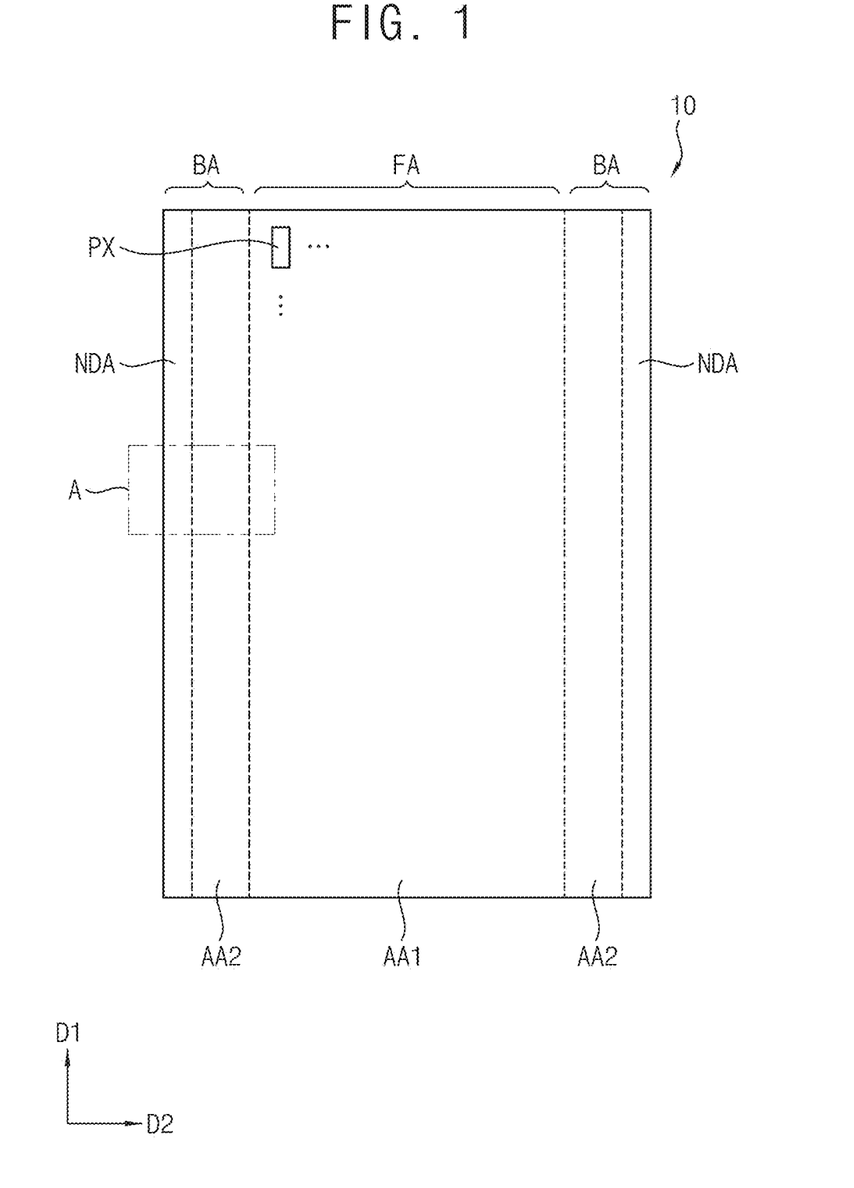
FIG. 1 is a plan view illustrating a display device according to an embodiment of the invention.
Figure 2:
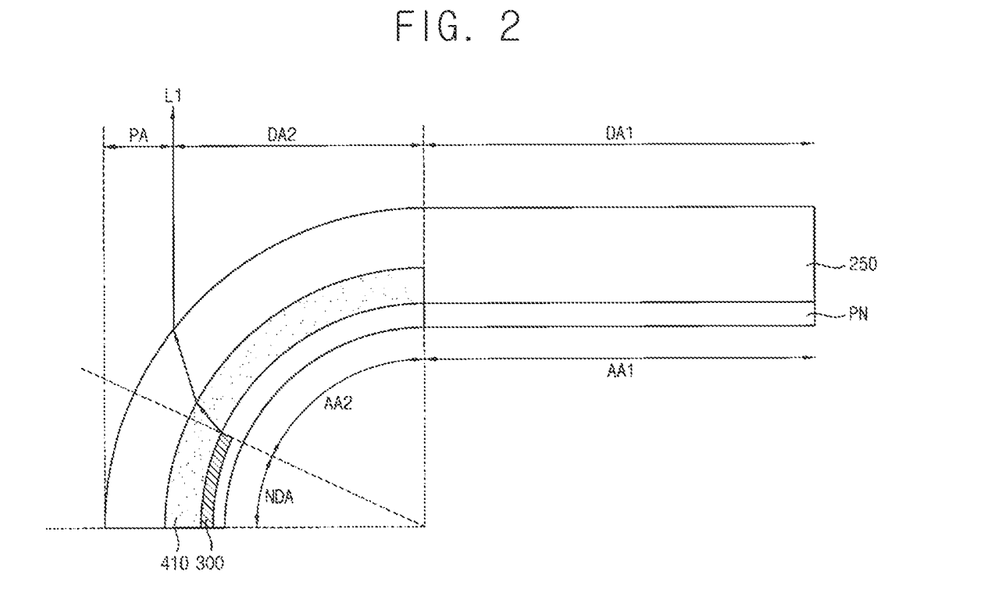
FIG. 2 is a cross-sectional view illustrating a region "A" shown in FIG. 1 of a display device according to an embodiment of the invention.

FIG. 1 is a plan view illustrating a display device according to an embodiment of the invention; and FIG. 2 is a cross-sectional view illustrating a region "A" shown in FIG. 1 of a display device according to an embodiment of the invention. FIG. 1 illustrates an unfolded display device for ease of explanation. FIG. 2 illustrates a display device having a bending area.

A display device 10 according to an embodiment may partially bend as illustrated in FIG. 2. For example, the display device 10 may include a flat area FA extending in a direction and a bending area BA extending from the flat area FA and bending with a curvature. For example, the bending area BA may have a uniform curvature with respect to an axis extending along a first direction D1.

In the display device 10, a display surface, on which an image is displayed, may extend from the flat area FA to the bending area BA.

In an embodiment, the display device 10 may include an active area that generates an image, and a non-display area NDA that does not generate an image. The active area includes a first active area AA1 disposed in the flat area FA and a second active area AA2 disposed in the bending area BA. Further, a portion of the bending area BA may correspond to the non-display area NDA. Thus, the second active area AA2 may be disposed between the non-display area NDA and the first active area AA1.

An array of pixels PX is disposed in the first active area AA1 and the second active area AA2 to generate an image. In an embodiment, each of the pixels PX may include a light-emitting element. For example, the light-emitting element may be an organic light-emitting diode.

A signal wiring, a power wiring, a driving circuit, or the like may be in the non-display area NDA.

Referring to FIG. 2, the display device 10 includes a panel part PN and a protective window 250 covering the panel part PN. The panel part PN and the protective window 250 may each include a flat area and a bending area.

In an embodiment, the display device 10 may include a light-blocking member 300 disposed in the non-display area NDA.

Herein, "display area" may refer to an area of an image perceived by a user in front of the display device 10. For example, an image generated in the first active area AA1 may be perceived as a first display area DA1, and an image generated in the second active area AA2 may be perceived as a second display area DA2.

In the bending area BA, a light exiting from the panel part PN is refracted when entering the protective window 250 disposed on the panel part PN, and is refracted again when exiting from the protective window 250. Thus, a size of the second display area DA2 may be determined depending on a position on which the light arrives at an exiting surface of the display device after exiting from the active area.

In an embodiment, the display device 10 includes a high-refractive member 410 disposed in the bending area BA. The high-refractive member 410 includes a material having a refractivity greater than that of the protective window 250. The high-refractive member 410 overlaps at least a portion of the second active area AA2. For example, the high-refractive member 410 may overlap a boundary between the second active area AA2 and the non-display area NDA.

Figure 3:
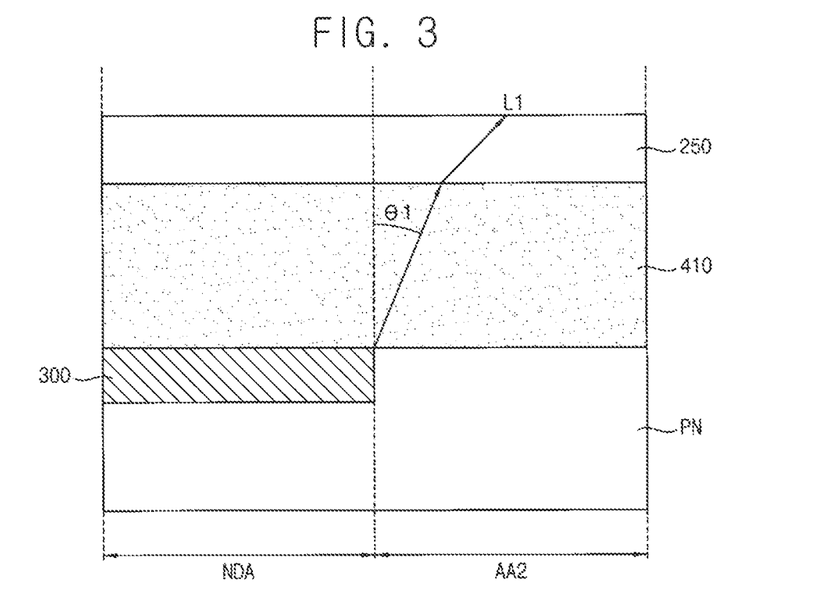
FIG. 3 is an enlarged cross-sectional view illustrating a bending area of a display device according to an embodiment of the invention.
Figure 5:
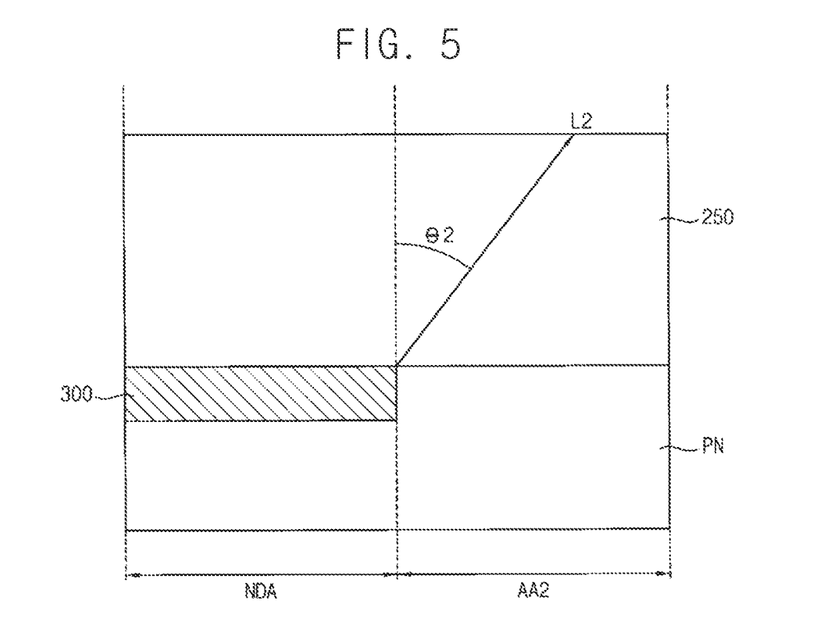
FIG. 5 is an enlarged cross-sectional view illustrating a bending area of a display device not including a high-refractive member.

FIG. 3 is an enlarged cross-sectional view illustrating a bending area of a display device according to an embodiment of the invention. FIG. 5 is an enlarged cross-sectional view illustrating a bending area of a display device not including a high-refractive member. For ease of explanation, interfaces in the bending area are illustrated to be flat in FIGS. 3 and 5.

Referring to FIGS. 2 and 3, a light L1 exiting from the second active area AA2 of the display device 10 according to an embodiment of the invention and entering the high-refractive member 410 is refracted at an interface.

Figure 4:
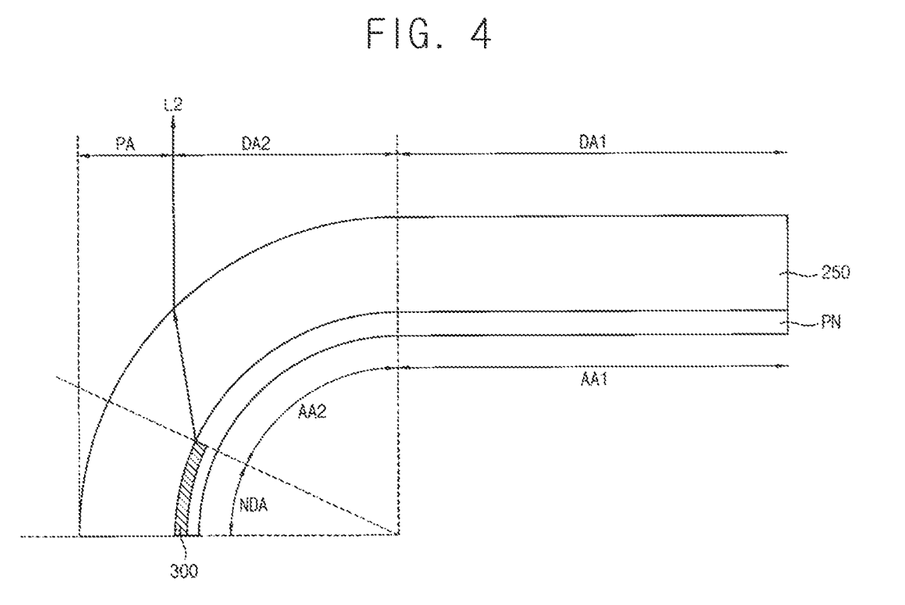
FIG. 4 is a cross-sectional view illustrating a display device not including a high-refractive member.

A refraction angle of a light passing through an interface of a medium is determined depending on a refractivity of the medium. Thus, a refraction angle $\theta 1$ of the light L1 entering the high-refractive member 410 having a refractivity greater than that of the protective window 250 is less than a refraction angle $\theta 2$ of a light L2 that directly enters the protective window 250 as illustrated in FIGS. 4 and 5.

Thus, a position on which a light exits from the display device may be shifted toward an outer edge of the display device. Thus, a size of a peripheral area PA may be substantially decreased, and a size of the display area may be substantially increased.

A material of the high-refractive member 410 may be varied depending on a material of the protective window 250.

In an embodiment, the protective window 250 may include glass. A refractivity of glass may be varied depending on composition of the glass. For example, the protective window 250 may include glass having a refractivity equal to or less than 1.47.

In an embodiment, when the protective window 250 includes glass having a refractivity equal to or less than 1.47, the high-refractive member 410 may include a polymeric material. For example, the high-refractive member 410 may include a material having a high transparency and having a refractivity greater than 1.47, such as polymethyl methacrylate (refractivity: about 1.49), polyvinyl alcohol (refractivity: about 1.48), polyimide (refractivity: about 1.50), cyclic olefin copolymer (refractivity: about 1.54), polycarbonate (refractivity: about 1.58), or a combination thereof.

In an embodiment, the high-refractive member 410 may include a cured resin. For example, the cured resin may be a cured acrylic resin formed from an acrylic monomer, an acrylic oligomer, or a combination thereof. For example, the cured resin may be formed from methyl methacrylate, aliphatic urethane acrylate, epoxy acrylate, phenoxyethyl acrylate, or a combination thereof. For example, the cured resin may have a refractivity equal to or more than 1.57.

In an embodiment, the high-refractive member 410 may include inorganic nano-particles dispersed in a flexible polymer matrix or in a cured resin. For example, the inorganic nano-particles may include niobium oxide, barium oxide, titanium oxide, zirconium oxide, tungsten oxide, or a combination thereof. The high-refractive member 410 including the inorganic nano-particles may have a refractivity equal to or more than 1.60. For example, a diameter of the inorganic nano-particle may be about 5 nm to about 50 nm.

In an embodiment, the high-refractive member 410 may include a metal oxide layer. For example, the metal oxide layer may include niobium oxide, barium oxide, titanium oxide, zirconium oxide, tungsten oxide, or a combination thereof. For example, the metal oxide layer may be formed on a surface of the protective window 250 through a deposition method, such as sputtering.

In an embodiment, the high-refractive member 410 may include a high-refractive glass. The high-refractive glass may include a metal oxide, which increases a refractivity, with a high content. For example, the high-refractive glass may include 15 wt % or more of niobium oxide, barium oxide, titanium oxide, zirconium oxide, tungsten oxide, or a combination thereof. The high-refractive glass may further include alkali metal oxide, boron oxide, magnesium oxide, calcium oxide, strontium oxide, aluminum oxide, or a combination thereof, as desired. In an embodiment, a refractivity of the high-refractive glass may be about 1.6 to about 1.85.

For example, a glass frit may be coated on a surface of the protective window 250 and then heat-treated to form the high-refractive member 410 including the high-refractive glass.

In an embodiment, the protective window 250 may include a polymeric material with a high flexibility. For example, the protective window 250 may include polyimide, polyacrylate, polymethyl methacrylate, polycarbonate, polyethylene naphthalate, polyvinylidene chloride, polyvinylidene fluoride, polystyrene, ethylene-vinyl alcohol copolymer, or a combination thereof.

For example, when the protective window 250 includes polyimide, the high-refractive member 410 may include a polymeric material having a refractivity greater than that of polyimide, such as cyclic olefin copolymer, polycarbonate, or the like.

In an embodiment, when the protective window 250 includes a polymeric material, the high-refractive member 410 may include the cured resin, the high-refractive glass, the inorganic nano-particles, or the metal oxide layer.

In an embodiment, when the protective window 250 includes a polymeric material, the protective window 250 may include a base film including a polymeric material and a hard coating layer to protect the base film.

The hard coating layer may include a cross-linked cured resin. For example, the hard coating layer may include a cured resin formed from at least one of an acrylate compound, a siloxane compound, and silsesquioxane compound.

In an embodiment, the protective window 250 may further include an anti-fingerprint layer covering the hard coating layer. The anti-fingerprint layer may function as an anti-fouling layer to prevent or substantially prevent the protective window from being contaminated by a fingerprint or the like. For example, the anti-fingerprint layer may include a fluorine-containing compound. In an embodiment, the anti-fingerprint layer may include a fluorine-containing silane or a reaction product thereof.

The high-refractive member 410 may be combined with the protective window 250 through various methods.

For example, the protective window 250 may have a groove formed at a surface thereof to receive the high-refractive member 410. A polymeric film, a composite film, a curable resin, a glass frit, or the like may be provided in the groove to form the high-refractive member 410.

Thus, a thickness of the protective window 250 in the bending area BA may be less than a thickness thereof in the flat area FA.

For example, the high-refractive member 410 having a film shape or a sheet shape may be attached to a surface of the protective window 250 through roll lamination, 3D lamination, or the like.

In an embodiment, the high-refractive member 410 may extend from the second display area DA2 to the first display area DA1. In view of mechanical properties and a transparency of the entire protective window 250, the high-refractive member 410 may, in an embodiment, be disposed selectively in the second display area DA2.

Figure 6:
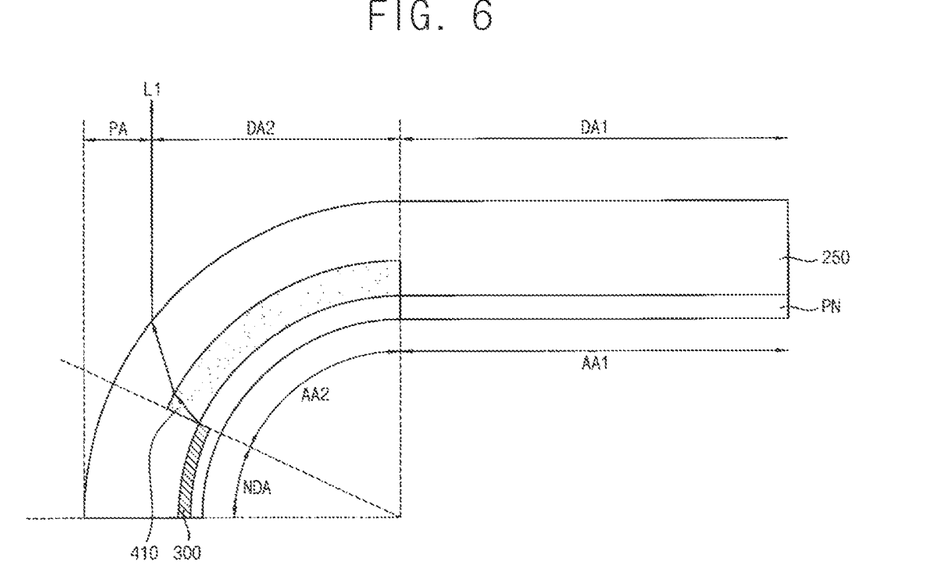
FIG. 6 is a cross-sectional view illustrating a display device according to an embodiment of the invention.

The light-blocking member 300 may include a light-blocking material, such as carbon black, a dye, a pigment, or the like. For example, the light-blocking member 300 may be a black matrix. In an embodiment, the light-blocking member 300 may be disposed between the high-refractive member 410 and the panel part PN in the non-display area NDA. However, embodiments of the invention are not limited thereto. For example, as illustrated in FIG. 6, the high-refractive member 410 may be disposed selectively on the second active area AA2, and the light-blocking member 300 may be combined with a surface of the protective window 250 or a surface of the panel part PN to be disposed between the protective window 250 and the panel part PN. In another embodiment, a light-blocking member may be disposed between a high-refractive member and a protective window.

Figure 7:
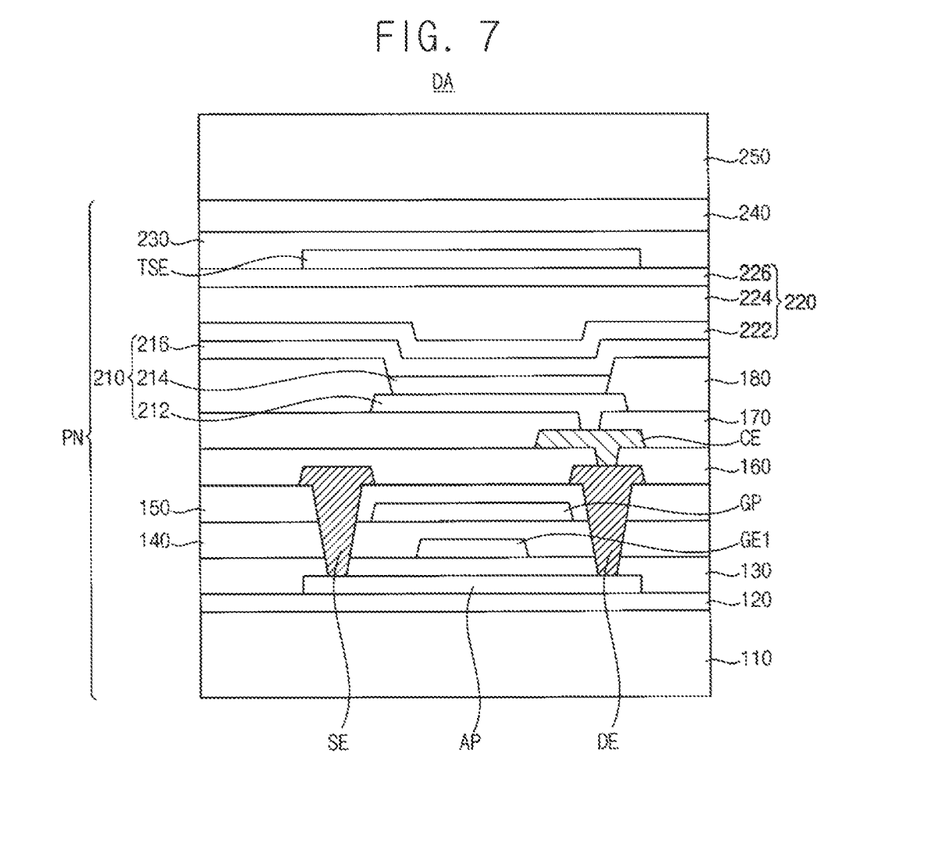
FIG. 7 is an enlarged cross-sectional view illustrating a display area of a display device according to an embodiment of the invention.

FIG. 7 is an enlarged cross-sectional view illustrating a display area of a display device according to an embodiment of the invention.

Referring to FIG. 7, a pixel unit disposed in a display area DA may include a transistor disposed on a base substrate 110 and a light-emitting element electrically connected to the transistor. In an embodiment, the light-emitting element may be an organic light-emitting diode.

A buffer layer 120 may be disposed on the base substrate 110. An active pattern AP may be disposed on the buffer layer 120.

For example, the base substrate 110 may be formed of a polymeric material having high flexibility. For example, the base substrate 110 may include polyethylene terephthalate, polyethylene naphthalate, polyether ketone, polycarbonate, polyarylate, polyether sulfone, polyimide, or a combination thereof. In another embodiment, the base substrate 110 may include a rigid material, such as glass, quartz, sapphire, or the like.

The buffer layer 120 may prevent or reduce permeation of impurities, humidity, or external gas from underneath of the base substrate 110, and may planarize an upper surface of the base substrate 110. For example, the buffer layer 120 may include an inorganic material, such as oxide, nitride, or the like.

A gate electrode GE1 may be disposed on the active pattern AP. A first insulation layer 130 may be disposed between the active pattern AP and the gate electrode GE1.

A gate wiring pattern GP may be disposed on the gate electrode GE1. The gate wiring pattern GP may include a capacitor electrode for forming a capacitor, a wiring for transferring various signals, or the like.

A second insulation layer 140 may be disposed between the gate electrode GE1 and the gate wiring pattern GP. A third insulation layer 150 may be disposed on the gate wiring pattern GP.

For example, the active pattern AP may include silicon or a metal oxide semiconductor. In an embodiment, the active pattern AP may include polycrystalline silicon (polysilicon), which may be doped with n-type impurities or p-type impurities.

In another embodiment or in another transistor that is not illustrated, an active pattern may include a metal oxide semiconductor. For example, the active pattern may include a binary compound (ABx), a ternary compound (ABxCy) or a quarternary compound (ABxCyDz), which contains indium (In), zinc (Zn), gallium (Ga), tin (Sn), titanium (Ti), aluminum (Al), hafnium (Hf), zirconium (Zr), or magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

The first insulation layer 130, the second insulation layer 140, and the third insulation layer 150 may include silicon oxide (SiOx), silicon nitride (SiNx), silicon carbide, or a combination thereof. In an embodiment, the first insulation layer 130, the second insulation layer 140, and the third insulation layer 150 may include an insulating metal oxide, such as aluminum oxide, tantalum oxide, hafnium oxide, zirconium oxide, titanium oxide, or the like. For example, the first insulation layer 130, the second insulation layer 140, and the third insulation layer 150 may each have a single-layered structure or a multiple-layered structure including silicon nitride and/or silicon oxide, or may have different structures from each other.

The gate electrode GE1 and the gate wiring pattern GP may include a metal, a metal alloy, a metal nitride, a conductive metal oxide, or the like. For example, the gate electrode GE1 and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers. In an embodiment, the gate electrode GE1 and the gate wiring pattern GP may have a multiple-layered structure including at least molybdenum.

A first source metal pattern may be disposed on the third insulation layer 150. The first source metal pattern may include a source electrode SE and a drain electrode DE, which contact the active pattern AP. The source electrode SE and the drain electrode DE may each pass through the insulation layers disposed thereunder to contact the active pattern AP.

A fourth insulation layer 160 may be disposed on the first source metal pattern. A second source metal pattern may be disposed on the fourth insulation layer 160. The second source metal pattern may include a connection electrode CE to electrically connect the drain electrode DE to an organic light-emitting diode 210 disposed thereon. In an embodiment, the second source metal pattern may further include a mesh power line to prevent or substantially prevent voltage drop of a power applied to the organic light-emitting diode 210. A fifth insulation layer 170 may be disposed on the second source metal pattern.

The first and second source metal patterns may include a metal, a metal alloy, a metal nitride, a conductive metal oxide, or the like. For example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers. In an embodiment, the first and second source metal patterns may have a multiple-layered structure including at least aluminum. For example, the first and second source metal patterns may have a stacked structure of an aluminum layer and a titanium layer.

In an embodiment, the fourth insulation layer 160 and the fifth insulation layer 170 may include an organic material. For example, the fourth insulation layer 160 and the fifth insulation layer 170 may include an organic insulation material such as a phenol resin, an acrylic resin, a polyimide resin, a polyamide resin, a siloxane resin, an epoxy resin, or the like.

The organic light-emitting diode 210 may be disposed on the fifth insulation layer 170. The organic light-emitting diode 210 may include a first electrode 212 contacting the connection electrode CE, a light-emitting layer 214 disposed on the first electrode 212, and a second electrode 216 disposed on the light-emitting layer 214. The first electrode 212 may be a lower electrode of the organic light-emitting diode 210, and the second electrode 216 may be an upper electrode of the organic light-emitting diode 210.

The first electrode 212 may function as an anode. For example, the first electrode 212 may be formed as a light-transmitting electrode or a light-reflecting electrode according to an emission type of the display device. When the first electrode 212 is a light-transmitting electrode, the first electrode 212 may include indium tin oxide, indium zinc oxide, zinc tin oxide, indium oxide, zinc oxide, tin oxide, or the like. When the first electrode 212 is a light-reflecting electrode, the first electrode 212 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof, and may have a stacked structure further including a material that may be used for the light-transmitting electrode.

A pixel-defining layer 180 has an opening exposing at least a portion of the first electrode 212. For example, the pixel-defining layer 180 may include an organic insulating material.

The light-emitting layer 214 may have a single-layered structure or a multi-layered structure including at least one of a hole injection layer, a hole transporting layer, an organic light-emitting layer, an electron transporting layer, and an electron injection layer. For example, the light-emitting layer 214 may include a low molecular weight organic compound or a high molecular weight organic compound.

In an embodiment, the light-emitting layer 214 may emit a red light, a green light, or a blue light. In another embodiment, the light-emitting layer 214 may emit a white light. The light-emitting layer 214 emitting a white light may have a multiple-layer structure including a red-emitting layer, a green-emitting layer, and a blue-emitting layer, or a single-layer structure including a mixture of a red-emitting material, a green-emitting material, and a blue-emitting material.

The second electrode 216 may be formed as a light-transmitting electrode or a light-reflecting electrode according to an emission type of the display device. For example, when the second electrode 216 is a light-transmitting electrode, the second electrode 216 may include a metal, a metal alloy, a metal nitride, a metal fluoride, a conductive metal oxide, or a combination thereof.

For example, the second electrode 216 may extend continuously across a plurality of pixels in the display area DA. In an embodiment, a capping layer and a blocking layer may be further formed on the second electrode 216.

The display device further includes an encapsulation layer 220 covering the organic light-emitting diode 210. In an embodiment, the encapsulation layer 220 may extend to entirely cover the display area DA.

For example, the encapsulation layer 220 may have a stacked structure of an inorganic thin film and an organic thin film. For example, as illustrated in FIG. 7, the encapsulation layer 220 may include a first inorganic thin film 222, an organic thin film 224 disposed on the first inorganic thin film 222, and a second inorganic thin film 226 disposed on the organic thin film 224. However, embodiments are not limited thereto. For example, the encapsulation layer 220 may have a structure including at least two organic thin films and at least three inorganic thin films.

For example, the organic thin film 224 may include a cured polymer, such as polyacrylate or the like. For example, the cured polymer may be formed from cross-linking reaction of monomers. For example, the inorganic thin films 222 and 226 may include an inorganic material, such as silicon oxide, silicon nitride, silicon carbide, aluminum oxide, tantalum oxide, hafnium oxide, zirconium oxide, titanium oxide, or the like.

In an embodiment, a touch-sensing part may be disposed on the encapsulation layer 220. The touch-sensing part may sense input position by contact. The touch-sensing part may be formed directly on the encapsulation layer 220 or may be combined with the encapsulation layer 220 as a screen panel after being individually manufactured.

For example, a touch-sensing electrode TSE and a touch insulation layer 230 covering the touch-sensing electrode TSE may be disposed on the encapsulation layer 220. For example, the touch-sensing electrode TSE may include a transparent conductive material, such as indium tin oxide, indium zinc oxide, or the like.

In an embodiment, a polarization layer 240 and a protective window 250 may be disposed on the touch-sensing part. An adhesive agent or a transparent adhesive film may be provided between the polarization layer 240 and the touch-sensing part and between the polarization layer 240 and the protective window 250.

In an embodiment, the panel part PN may be configured to include a transistor, the organic light-emitting diode 210, the encapsulation layer 220, the touch-sensing part and the polarization layer 240. However, embodiments are not limited thereto, at least one of the touch-sensing part and the polarization layer 240 may be omitted as desired.

Figure 8:
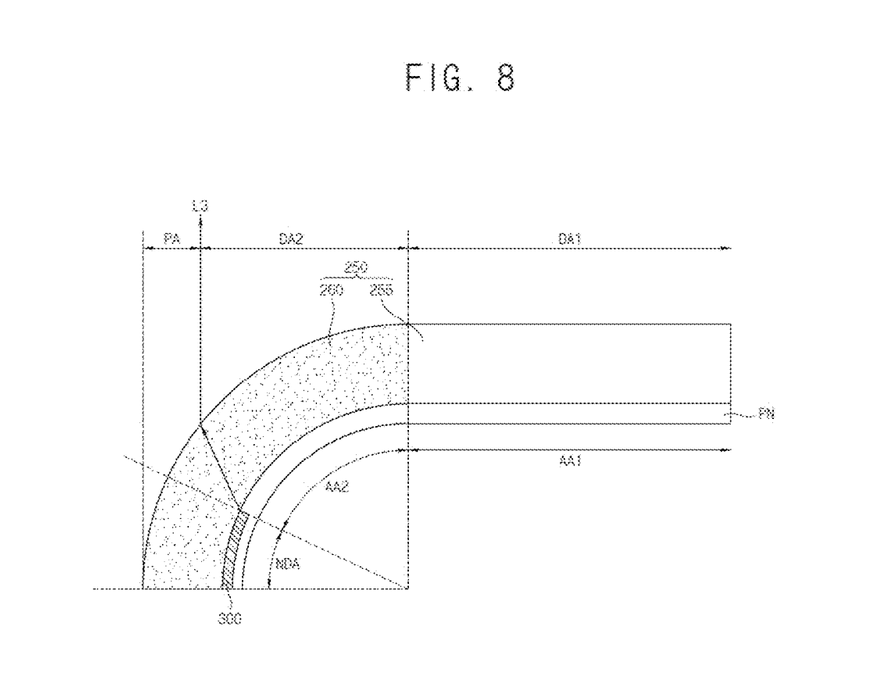
FIGS. 8 to 10 are cross-sectional views illustrating a display device according to some embodiments of the invention.
Figure 9:
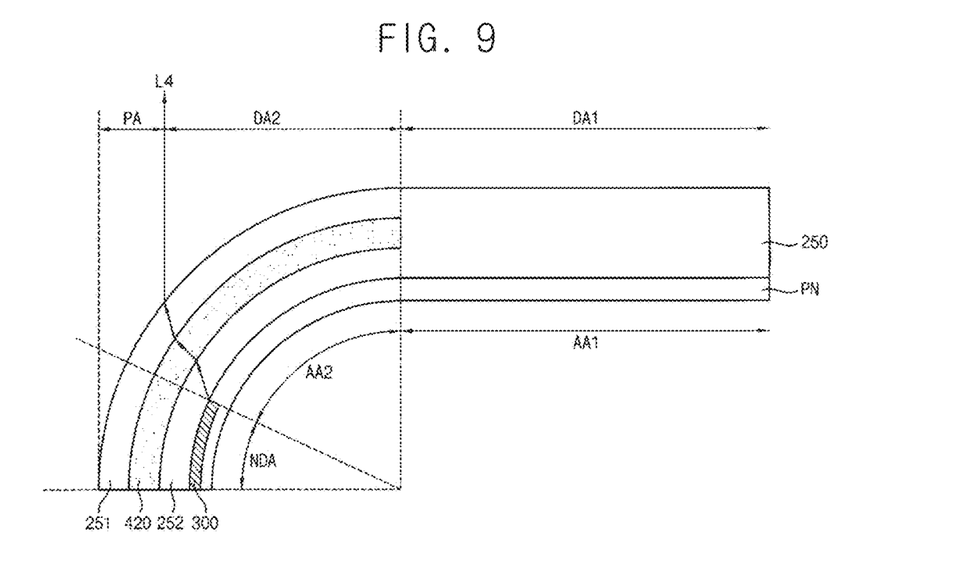
Figure 10:
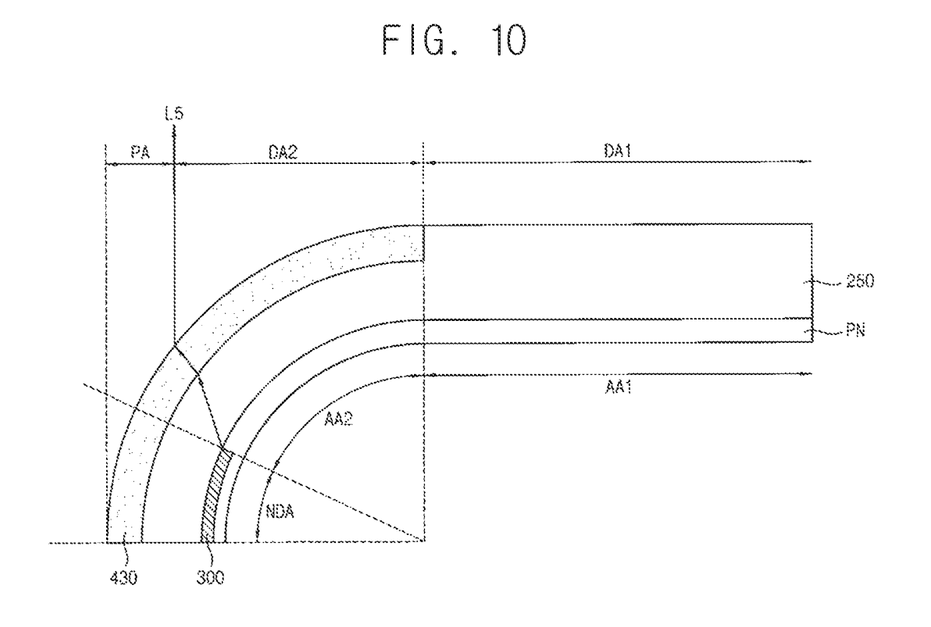

FIGS. 8 to 10 are cross-sectional views illustrating a display device according to some embodiments of the invention.

Referring to FIG. 8, a protective window 250 may include a low-refractive portion 255 disposed in a flat area and a high-refractive portion 260 disposed in a bending area.

The high-refractive portion 260 may include a material having a refractivity greater than that of the low-refractive portion 255.

For example, when the low-refractive portion 255 includes glass, the high-refractive portion 260 may include a polymeric material having a refractivity greater than that of the glass, a cured resin, a high-refractive glass, inorganic nano-particles, or a metal oxide layer.

Further, when the low-refractive portion 255 includes a polymeric material, the high-refractive portion 260 may include a polymeric material having a refractivity greater than that of the polymeric material of the low-refractive portion 255, a cured resin, a high-refractive glass, inorganic nano-particles, or a metal oxide layer.

According to an embodiment, the protective window may include a high-refractive material entirely in the bending area. Thus, a position of a light L3, when the light arrives at a light-exiting surface of the protective window after exiting from a second active area AA2, may be shifted toward an outer edge of a display device. Thus, a second display area DA2 may be expanded.

Referring to FIG. 9, in an embodiment, a high-refractive member 420 may be embedded in a protective window 250. For example, the high-refractive member 420 may be disposed between a first low-refractive layer 252 and a second low-refractive layer 251 of the protective window 250 in a bending area.

Thus, when a light L4 exiting from an edge of a second active area AA2 enters the high-refractive member 420 from the first low-refractive layer 252, a refraction angle is reduced. Thus, a portion of the light arriving at a light-exiting surface of the protective window may be shifted toward an outer edge of a display device. Thus, a second display area DA2 may be expanded.

Referring to FIG. 10, in an embodiment, a high-refractive member 430 may be disposed on an outer side surface of a protective window 250.

Thus, when a light L5 exiting from an edge of a second active area AA2 enters the high-refractive member 430 from the protective window 250, a refraction angle is reduced. Thus, a portion of the light arriving at a light-exiting surface of a display device may be shifted toward an outer edge of the display device. Thus, a second display area DA2 may be expanded.

The foregoing is illustrative of embodiments and is not to be construed as limiting thereof. Although some embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as set forth in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The invention may be applied to various display devices. For example, the invention may be applied to a vehicle display device, a ship display device, an aircraft display device, portable communication devices, display devices for display or for information transfer, a medical display device, etc.

The invention claimed is:

1. A display device including a flat area extending in a direction and a bending area having a curvature, the display device comprising:
   a panel part including a pixel array and including a first active area located in the flat area and a second active area located in the bending area;
   a protective window covering the panel part; and
   a high-refractive member on the panel part in the bending area and configured to pass light from the panel part therethrough, the high-refractive member including a material having a refractivity greater than a refractivity of the protective window.

2. The display device of claim 1, wherein the high-refractive member is between the protective window and the panel part in the bending area.

3. The display device of claim 1, wherein the high-refractive member is between a first low-refractive layer and a second low-refractive layer of the protective window in the bending area.

4. The display device of claim 1, wherein the protective window includes glass, and the high-refractive member includes at least one selected from the group consisting of polymethyl methacrylate, polyvinyl alcohol, polyimide, cyclic olefin copolymer, and polycarbonate.

5. The display device of claim 1, wherein the protective window includes polyimide, and the high-refractive member includes at least one selected from the group consisting of cyclic olefin copolymer and polycarbonate.

6. The display device of claim 1, wherein the high-refractive member includes a cured acrylic resin.

7. The display device of claim 1, wherein the high-refractive member includes inorganic nano-particles dispersed in a flexible polymer matrix or in a cured resin.

8. The display device of claim 7, wherein the inorganic nano-particles include at least one selected from the group consisting of niobium oxide, barium oxide, titanium oxide, zirconium oxide, and tungsten oxide.

9. The display device of claim 1, wherein the high-refractive member includes a metal oxide layer.

10. The display device of claim 1, wherein the high-refractive member includes a high-refractive glass including at least 15 wt % of niobium oxide, barium oxide, titanium oxide, zirconium oxide, tungsten oxide, or a combination thereof.

11. The display device of claim 1, further comprising a light-blocking member that overlaps a non-display area of the panel part in the bending area.

12. The display device of claim 1, wherein a thickness of the protective window in the bending area is less than a thickness of the protective window in the flat area.

13. The display device of claim 1, wherein the pixel array includes an organic light-emitting diode.

14. A display device including a flat area extending in a direction and a bending area having a curvature, the display device comprising:
a panel part including a pixel array and including a first active area located in the flat area and a second active area located in the bending area;
a protective window covering the panel part; and
a high-refractive member on the panel part in the bending area and including a material having a refractivity greater than a refractivity of the protective window,
wherein the protective window is between the high-refractive member and the panel part in the bending area.

15. A display device including a flat area extending in a direction and a bending area having a curvature, the display device comprising:
a panel part including a pixel array and including a first active area located in the flat area and a second active area located in the bending area; and
a protective window covering the panel part,
wherein the protective window includes a low-refractive portion located in the flat area and a high-refractive portion located in the bending area and having a refractivity greater than a refractivity of the low-refractive portion.

16. The display device of claim 15, wherein the protective window includes glass or polyimide.

17. The display device of claim 15, wherein the high-refractive portion includes at least one selected from the group consisting of polymethyl methacrylate, polyvinyl alcohol, polyimide, cyclic olefin copolymer, and polycarbonate.

18. The display device of claim 15, wherein the high-refractive portion includes a cured acrylic resin.

19. The display device of claim 15, wherein the high-refractive portion includes inorganic nano-particles dispersed in a flexible polymer matrix or in a cured resin.

20. The display device of claim 15, wherein the high-refractive portion includes a high-refractive glass including at least 15 wt % of niobium oxide, barium oxide, titanium oxide, zirconium oxide, tungsten oxide, or a combination thereof.

* * * * *